United States Patent
Haubrich et al.

(10) Patent No.: US 6,911,385 B1
(45) Date of Patent: Jun. 28, 2005

(54) INTERFACE LAYER FOR THE FABRICATION OF ELECTRONIC DEVICES

(75) Inventors: Scott Haubrich, Castro Valley, CA (US); Klaus Kunze, Half Moon Bay, CA (US); James C Dunphy, San Jose, CA (US); Chris Gudeman, Los Gatos, CA (US); Joerg Rockenberger, Redwood City, CA (US); Fabio Zurcher, Brisbane, CA (US); Nassrin Sleiman, Sunnyvale, CA (US); Mao Takashima, Mountain View, CA (US); Chris Spindt, Menlo Park, CA (US)

(73) Assignee: Kovio, Inc., Sunnyvale, CA (US)

( * ) Notice: Subject to any disclaimer, the term of this patent is extended or adjusted under 35 U.S.C. 154(b) by 0 days.

(21) Appl. No.: 10/226,903

(22) Filed: Aug. 22, 2002

(51) Int. Cl.$^7$ ............................................... H01L 21/44
(52) U.S. Cl. ..................................................... 438/610
(58) Field of Search ................................. 438/121, 122, 438/610, 154, 157, 584, 605, 592, 625, 627, 629, 655

(56) References Cited

U.S. PATENT DOCUMENTS

| | | | | |
|---|---|---|---|---|
| 5,059,242 A | | 10/1991 | Firmstone et al. ......... 106/1.23 |
| 5,110,760 A | * | 5/1992 | Hsu ............................ 438/666 |
| 5,259,926 A | | 11/1993 | Kuwabara et al. .......... 156/659 |
| 5,262,357 A | * | 11/1993 | Alivisatos et al. .......... 438/488 |
| 5,281,447 A | * | 1/1994 | Brady et al. ................ 427/555 |
| 5,512,131 A | * | 4/1996 | Kumar et al. ............... 438/738 |
| 5,559,057 A | * | 9/1996 | Goldstein ................... 438/725 |
| 5,718,800 A | * | 2/1998 | Juengling ................... 438/200 |
| 5,772,905 A | | 6/1998 | Chou ........................... 216/44 |
| 5,882,722 A | * | 3/1999 | Kydd ........................... 427/96 |
| 5,894,038 A | | 4/1999 | Sharma et al. .............. 427/554 |
| 5,900,160 A | * | 5/1999 | Whitesides et al. ........... 216/41 |
| 6,039,897 A | | 3/2000 | Lochhead et al. ......... 264/1.24 |
| 6,086,790 A | * | 7/2000 | Hayashi et al. ............. 252/500 |
| 6,159,839 A | * | 12/2000 | Jeng et al. .................. 438/618 |
| 6,180,239 B1 | | 1/2001 | Whitesides et al. ....... 428/411.1 |
| 6,322,736 B1 | | 11/2001 | Bao et al. .................... 264/105 |
| 6,375,870 B1 | | 4/2002 | Visovsky et al. ........... 264/1.31 |
| 6,380,101 B1 | | 4/2002 | Breen et al. ................ 438/765 |
| 6,403,397 B1 | | 6/2002 | Katz ............................ 438/99 |
| 6,517,995 B1 | * | 2/2003 | Jacobson et al. ........... 430/320 |
| 6,518,168 B1 | | 2/2003 | Clem et al. ................. 438/623 |
| 6,524,663 B1 | * | 2/2003 | Kelly et al. ................. 427/553 |
| 6,605,496 B1 | * | 8/2003 | Yamazaki ................... 438/166 |
| 6,630,201 B2 | * | 10/2003 | Chiang et al. ........... 427/255.28 |
| 6,699,723 B1 | * | 3/2004 | Weiss et al. ................ 436/518 |
| 2002/0050220 A1 | | 5/2002 | Schueller et al. ........... 101/486 |
| 2003/0047535 A1 | | 3/2003 | Schueller et al. ............. 216/41 |
| 2003/0082485 A1 | | 5/2003 | Bulthaup et al. ........... 430/312 |
| 2003/0180451 A1 | * | 9/2003 | Kodas et al. ................ 427/123 |
| 2003/0203649 A1 | | 10/2003 | Carter ........................ 438/780 |

\* cited by examiner

*Primary Examiner*—W. David Coleman
(74) *Attorney, Agent, or Firm*—Haverstock & Owens LLP

(57) ABSTRACT

The present invention is directed to methods for making electronic devices with a thin anisotropic conducting layer interface layer formed between a substrate and an active device layer that is preferably patterned conductive layer. The interface layer preferably provides Ohmic and/or rectifying contact between the active device layer and the substrate and preferably provides good adhesion of the active device layer to the substrate. The active device layer is preferably fashioned from a nanoparticle ink solution that is patterned using embossing methods or other suitable printing and/or imaging methods. The active device layer is preferably patterned into an array of gate structures suitable for the fabrication of thin film transistors and the like.

56 Claims, 9 Drawing Sheets

INTERFACE LAYER FOR THE FABRICATION OF ELECTRONIC DEVICES

FIELD OF THE INVENTION

The present invention relates to electronic devices. More specifically, the present invention relates to the method of fabricating electronic devices.

BACKGROUND OF THE INVENTION

Ultra-fine particles or nanoparticle (particles having an average diameter of 200 nanometers or less) are believed to be useful in the fabrication of microelectronic devices. Alivisatos et al., in U.S. Pat. No. 5,262,357, describe a method for making semiconductor nanoparticles from semiconductor precursors. Alivisatos et al. describe using these semiconductor nanoparticles to make continuous semiconductor films. Because the semiconductor nanoparticles exhibit significantly lower melting temperature than bulk materials, a layer of the semiconductor nanoparticles can be deposited on a substrate and annealed at relatively low temperatures, whereby the nanoparticles melt to form a continuous film.

One of the goals for nanotechnology is to develop techniques and materials that will allow for the fabrication of microelectronic devices on a variety of substrates using selective deposition, printing and/or imaging technologies. These selective deposition, printing and/or imaging technologies can utilize nanoparticles, or inks comprising nanoparticles, to fabricate layers in microelectronic devices.

There have been recent efforts to make metal-based solutions, which can be used to make conductive device layers in the fabrication of microelectronic devices. For example, Kydd in U.S. Pat. No. 5,882,722 describes a method of forming conductive layers from a suspension of mixtures of a metal powder and an organometallic compound dispensed in an organic solvent. The suspension is deposited onto a substrate to form a layer. The layer is then cured to form the conductive layer.

One of the shortcomings of fabricating thin conductive layers with liquids comprising metal-based materials, such as described above, is that the layers tend to exhibit poor adhesion and delaminate from the substrate and/or form irregularities during and/or after the curing process. Further, there is a tendency for hillock formation and/or pin hole formation during and/or after the curing process. Therefore, there is a need to develop suitable substrates and/or methods for depositing, printing and/or imaging liquid metal-based materials, which provide improved adhesion and reduced topographical irregularities in the resultant films during and/or after the curing process and which can be used to form active device layers in the fabrication of microelectronic devices.

SUMMARY OF THE INVENTION

The present invention is directed to methods for making electronic devices, such as thin film transistors (TFTs). In accordance with the embodiments of the invention, an electronic device, or a portion thereof, is fabricated by forming an interface layer on a suitable substrate. Preferably, the interface layer is formed from a liquid ink. The interface layer is a continuous interface layer or a patterned interface layer, as described in detail below. Suitable substrates include, but are not limited to, silicon substrates, quartz substrates, glass substrates, metal substrates (such as steel) and polymeric substrates (such as polyimide). The interface layer is preferably an ultra thin layer (on the order or 300 Angstroms or less) and preferably comprises a metal such as Pd, Pt, Bi, Pb, Sn, Cu, Ni, W, Al, Cr, Mo, Ti, Co, Fe or a combination thereof. The interface layer, in accordance with the embodiments of the invention, is a metallic layer, a metal oxide layer, a metal silicide layer or a combination thereof. The interface layer, used herein, is not intended to necessarily imply a continuous layer or a uniform layer. In fact, interface layers, in accordance with the present invention, can exhibit island structures with regions of more and less metal.

In accordance with the preferred method of the invention, an interface layer is preferably formed by depositing a liquid ink onto the substrate, wherein the interface ink comprises one or more precursors comprising a metal, such as, Pd, Pt, Bi, Pb, Sn, Cu, Ni, W, Al, Cr, Ti, Co, Fe or Mo and a suitable solvent. The interface precursor is preferably an organometallic complex including, but not limited to metal carboxylates, alkoxides, alkyls, aryls, alkynes, alkenes, β-diketonates, amides and thiolates, wherein the solvent is removed and the interface precursor is decomposed to form the interface layer during a thermal, photolytic or e-beam curing process. In yet a further embodiment of the invention, the interface precursor is a nanoparticle precursor comprising a metal, such as, Pd, Pt, Bi, Pb, Sn, Cu, Ni, W, Al, Cr, Ti, Co, Fe or Mo. The nanoparticle precursor used for forming interface layers preferably comprises nanoparticles that have sizes in a range of 1.0–100 nanometers.

On top of the interface layer, an active device layer is formed. The active device layer is preferably a conducting layer. The interface layer preferably provides ohmic contact between the active device layer and the substrate such as a silicon-wafer or α-Si on glass and helps to promote adhesion of the active device layer to the substrate. The interface layer is most preferably an anisotropic conducting layer, wherein the interface layer is conducting through the interface layer to the substrate, but is semiconducting or insulating laterally along the interface layer, thereby allowing for the formation of an active device layer with electrically isolated regions.

In accordance with the embodiments of the invention, an interface layer is formed by depositing a layer of material that is thicker than 30 Angstroms and uniformly etching the layer to a thickness of 30 Angstroms or less. Preferably, the interface layer is deposited to a suitable thickness by spin coating, ink-jet coating, sputter coating or any other suitable deposition method such as chemical vapor deposition (CVD) or plasma enhanced chemical vapor deposition (PECVD). For example, an interface layer is formed by depositing a metal precursor, such as an organometallic precursor, that is thermally and/or photolytically cured and/ or decomposed on the substrate to form the interface layer.

In accordance with the embodiments of the invention, an interface layer is formed by depositing the interface precursor on the entire surface of the substrate and curing. Alternatively, the interface precursor is patterned during deposition prior to curing. In yet further embodiments the interface layer is patterned at the same time a subsequent device layer is patterned. In yet further embodiments of the invention, the patterned device layer is utilized as a mask for patterning the interface layer therebelow and/or layers below the interface layer. Preferably, after the interface layer is formed, then the active device layer is formed directly on the continuous interface layer or patterned interface layer to provide the desired electrical contact (Ohmic and/or rectifying) between the active device layer and the substrate.

The active device layer is preferably formed by depositing an ink solution comprising metal nanoparticles. The ink solution preferably comprises metal nanoparticles comprising one or more metals of Ag, Pd, Rh, Cu, Pt, Ni, Fe, Ru, Os, Mn, Sn, Cr, Mo, W, Co, Ir, Zn and Cd. Methods for making metal nanoparticles and nanoparticle inks are described in U.S. patent Ser. No. 10/215,952, entitled "Nanoparticle Synthesis and the Formation of Inks Therefrom", the contents of which are hereby incorporated by reference.

The ink solution is either deposited as a continuous film, which is subsequently patterned, or the ink solution is selectively deposited in a pattern. Methods for coating and patterning ink solutions are further described in U.S. patent application Ser. No. 09/525,734, entitled "Fabrication of Finely Features Devices by Liquid Embossing" and in U.S. patent application Ser. No. 09/519,722, entitled "Method for Manufacturing Electronic and Electro Mechanical Elements and Device by Thin Film Deposition and Imaging", the contents of which are both hereby incorporated by reference. Regardless of the method of deposition, the ink and/or the interface precursor is cured after and/or while being deposited onto a suitable substrate.

DETAILED DESCRIPTION OF A PREFERRED EMBODIMENT

Figure 1A:
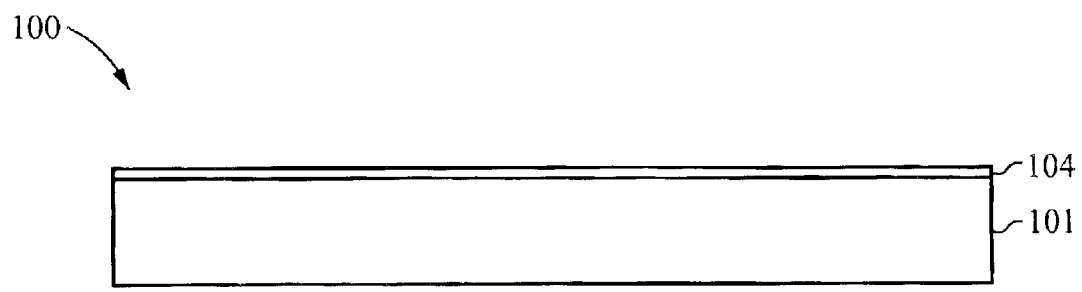
FIGS. 1a–c illustrate a substrate with an interface layer, in accordance with the embodiments of the invention.
Figure 1B:
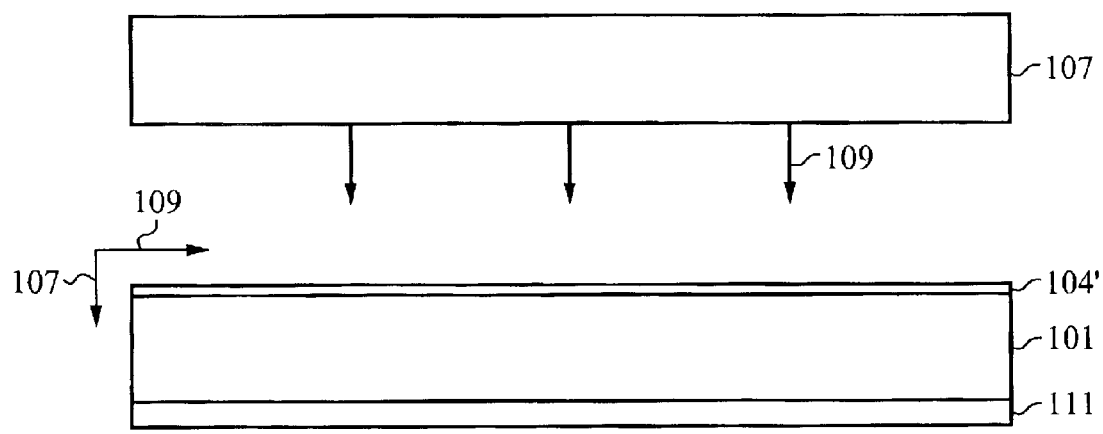

Referring to FIGS. 1a–b, in accordance with the embodiments of the invention, an interface layer 104' (FIG. 1b) is formed by depositing a thin layer 104 of material comprising a suitable interface precursor onto a substrate 101. The substrate 101 is a silicon, quartz, glass, polymer, metal, or any other substrate suitable for the application at hand. The thin layer 104 can be deposited onto the substrate 101 using any number of methods including, slide bar coating, ink-jet coating, screen printing, dip coating and vapor deposition methods to name a few. Preferably, the thin layer 104 is deposited on the substrate 101 using spin coating techniques.

In accordance with the embodiments of the invention, the interface precursor comprises of one or more metals of Pd, Pt, Bi, Pb, Sn, Cu, Ni, W, Al, Cr, Ti, Co, Fe or Mo. The interface precursor is preferably an organometallic complex including, but not limited to metal carboxylates, alkoxides, alkyls, aryls, alkynes, alkenes, β-diktonates, amides and thiolates. In accordance with a preferred method of the invention, the metal precursor comprises a metal carboxylate, such as a metal oleate, 2-hexyldecanoate, 2-ethylhexanoate and neodecanoate or combination thereof, wherein the metal carboxylate is capable of being decomposed on the substrate 101 by one or more of the curing methods described below. The metal carboxylate, in accordance with the present invention can be formed in situ by mixing a metal complex with a carboxylic acid, also described below (see examples). In yet a further embodiment of the invention, the interface precursor are nanoparticles comprising a metal, such as, Pd, Pt, Bi, Pb, Sn, Cu, Ni, W, Al, Cr, Ti, Co, Fe or Mo, wherein the nanoparticles have average sizes in a range of 1.0 to 100 nanometers. Nanoparticle precursors can be made to have metal loadings of 0–50 mass % (based on metal) depending on the solvent(s) and/or surfactant(s) used.

In accordance with the preferred embodiment of the invention, the thin layer is formed from a liquid precursor ink comprising the interface precursor and a suitable solvent medium. The interface ink is preferably formulated by mixing one or more metal complexes of Pd, Bi, Pb, Sn, Cu, W, Ni, Al, Cr, Ti, Co, Fe or Mo in the solvent medium with mass loading of <5% by Wt. Suitable solvent media include carboxylic acids, hydrocarbons, alcohols, esters, ketones and ethers. Examples include, toluene, cyclohexylbenzene, decaline, 2-ethylhexanol, terpineol, 3-octanol 1-octanol, 2-hexyldecanoic acid, 2-ethylhexanoic acid, neodecanoic acid and combinations thereof. Interface ink formulations, in accordance with further embodiments, comprise one or more nonionic surfactants to help wetting the interface ink onto the substrate 101 during the deposition process. Suitable surfactants include, but are not limited to polyethers, amineoxides, alkyl polyglycosides and fatty alcohols.

In accordance with alternative embodiments of the invention, the liquid precursor ink comprises metal nanoparticles comprising a metal that is the same or different than the metal nanoparticles inks used to form the active device layer.

Still referring to FIGS. 1a–b, after the layer 104 of interface ink comprising the interface precursor is deposited onto the substrate 101, then the layer 104 is preferably cured using a radiation source 107 to form a solid interface layer 104'. In the case where the interface precursor is deposited onto the substrate as a liquid precursor ink, curing the layer 104 involves removing the solvent medium and decomposing the interface precursor. The radiation source 107 is configured to deliver heat, light, a beam of electrons 109 or any combination thereof to the liquid layer 104. Alternatively, or in addition to using the radiation source 107, a second radiation source 111 is used to cure the liquid layer 104, wherein liquid layer 104 is cured through radiation that is transmitted through the substrate 101.

In yet a further embodiment of the invention, after the layer 104 of interface ink comprising the interface precursor is deposited onto the substrate 101 and the interface precursor is patterned prior to curing using embossing techniques, such as below. Alternatively, an interface ink is deposited onto the substrate and device layer ink, for forming an active device layer, is deposited over the wet interface ink using spin coating for example. In accordance with this embodiment of the invention, the interface ink layer and the device layer ink are collectively patterned using embossing techniques, such as described below, and cured after being patterned.

In yet further embodiments of the invention, an interface layer 104' is formed in situ using chemical vapor deposition techniques, wherein an interface precursor is cured while being deposited on the substrate 101. For example, an interface precursor, that is either neat or mixed with a carrier gas and/or solvent, is passed over the substrate 101 as a chemical vapor in, a vacuum flow chamber (not shown). By controlling the flow of the chemical vapor and the temperature of the substrate, the morphology, the thickness and the composition of the interface layer 104' formed can be controlled. In yet further embodiments of the invention, deposition of the interface layer from a chemical vapor comprising the interface precursor is facilitated photolytically or by using a plasma source.

Regardless of how the interface layer 104' is formed, the interface layer 104' is preferably a very thin interface layer (on the order of 30 Angstroms or less) and is an anisotropic conducting layer, wherein the interface layer 104' is conducting in a direction 107 through the interface layer 104 to the substrate 01, but is semiconducting or insulating in a direction 109 laterally along the interface layer 104. Accordingly, an active device layer 115 can be formed on the interface layer 104', wherein the active device layer 115 comprises electrically isolated structures 117. It will be clear to one skilled in the art that the interface layer 104' can be a metallic layer, a metal oxide layer, a metal silicide layer or a combination thereof and the exact composition of the interface layer 104' will depend on the precursor, the substrate, the ink formulation and/or the deposition method used.

Figure 1C:
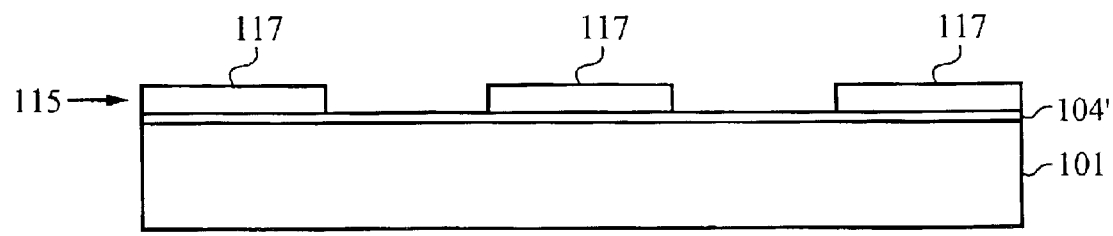

Referring now to FIG. 1c, after the interface layer 104' is formed, then on top of the interface layer 104' the active device layer 115 is formed. The active device layer 115 is preferably a conductive device layer with electrically isolated print features 117, as explained previously, wherein the interface layer 104' provides ohmic contact between the active device layer 115 and the substrate 101 and also promotes adhesion of the active device layer 115 to the substrate 101.

Still referring to FIG. 1c, the active device layer 115 is preferably formed onto the interface layer 104' by depositing an ink onto the interface layer. The ink, in accordance with the embodiments of the invention is deposited as a continuous film (not shown) which is subsequently patterned with print features 117, or alternatively is selectively deposited as print features 117 using one or more of deposition methods described below.

An ink, in accordance with the present invention preferably comprises metal nanoparticles comprising one or more metals of Ag, Pd, Rh, Cu, Pt, Ni, Fe, Ru, Os, Mn, Sn, Cr, Mo, W, Co, Ir, Zn and Cd. Nanoparticles are preferably formed by reducing a metal precursor in the presence of a suitable reaction medium, such as one or more long branched and/or un-branched carboxylic acids. In a preferred method of the present invention, the metal precursor is a metal oxide that is reduced in the reaction medium using a chemical reducing agent, such as an aldehyde, or is thermally reduced by heating a reaction mixture of the precursor and the reaction medium to temperature sufficient to induce the decomposition of the metal precursor and/or combination thereof. The reaction medium, in accordance with the embodiments of the invention also comprises solvent and/or surfactants.

After the metal nanoparticles are synthesized, the nanoparticles are isolated, washed and dispersed into a suitable print ink solvent. Alternatively, after the metal nanoparticles are synthesized, the metal nanoparticles are isolated, washed and treated with a suitable surfactant and then are dispersed into a suitable ink solvent. Additional details of methods for synthesizing metal nanoparticles and inks therefrom are described in U.S. patent Ser. No. 10/215,952, titled "Nanoparticle Synthesis and the Formation of Inks Therefrom", filed Sep. 9, 2002, referenced previously.

A nanoparticle print ink, in accordance with the embodiments of the invention, is deposited as a continuous film onto the interface layer 104' using ink-jet printing, slide coating, spin coating or any other suitable deposition method. The continuous film of nanoparticle print ink is then patterned using liquid embossing, photo-imaging, etching or a combination thereof. Method for coating and patterning nanoparticle print inks are further described in U.S. patent application Ser. No. 09/525,734, entitled "Fabrication of Finely Features Devices by Liquid Embossing" and in U.S. patent application Ser. No. 09/519,722, entitled "Method for Manufacturing Electronic and Electro Mechanical Elements and Device by Thin Film Deposition and Imaging", also both referenced previously.

In yet further embodiments of the invention, a nanoparticle ink is selectively deposited in a pattern of features 117 using one or more selective deposition techniques, such as ink-jet printing or micro-stencil printing. Method for selectively depositing nanoparticle inks using Micro-stencil printing techniques are described in U.S. patent application Ser. No. 10/007,122, entitled "Micro-Stencil", also referenced previously.

Figure 2:
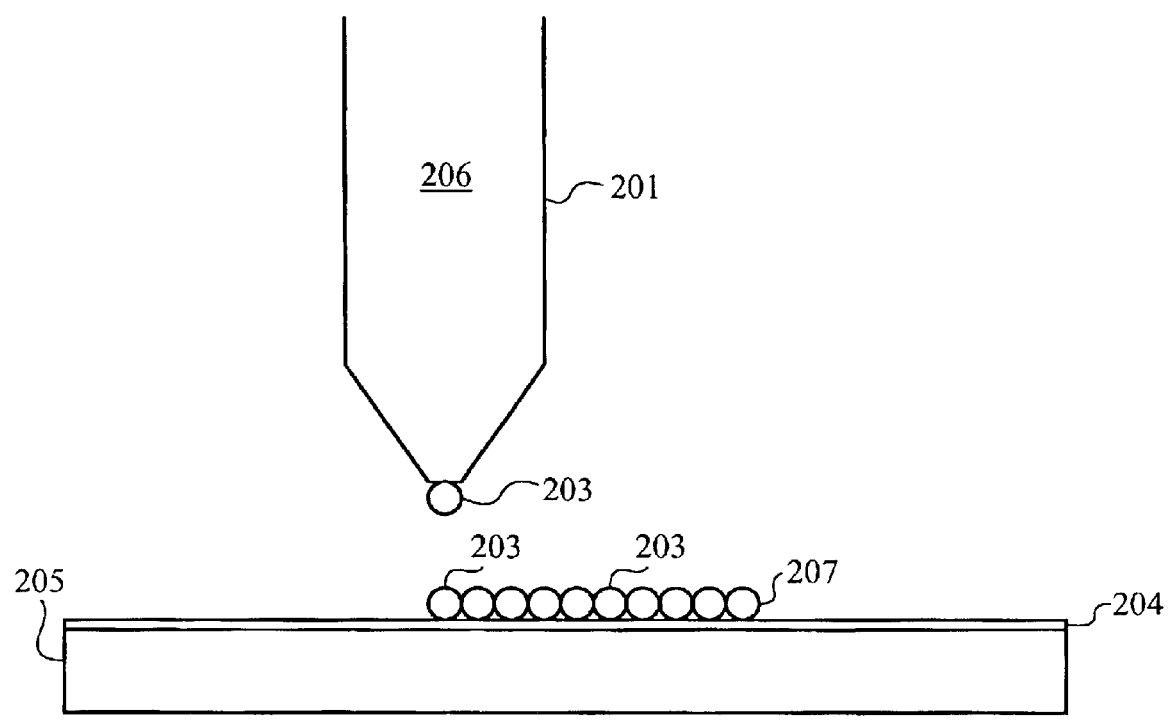
FIG. 2 illustrates depositing a metal nanoparticle ink on a substrate with an interface layer using a micro-pipette technique, in accordance with the invention.
Figure 3:
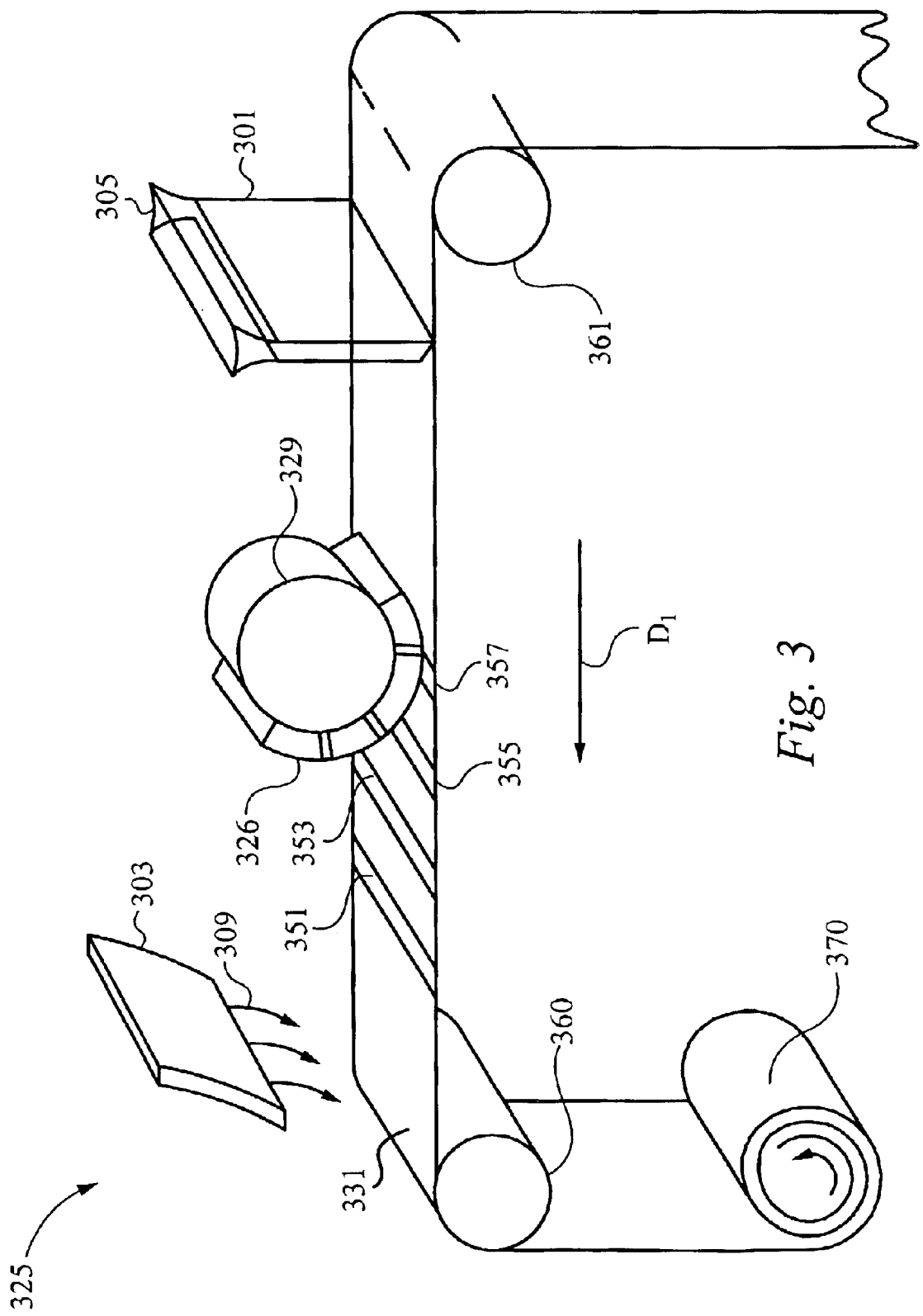
FIG. 3 illustrates slide coating a continuous film of a metal nanoparticle ink onto a substrate with an interface layer and patterning the film using an embossing technique, in accordance with the present invention.
Figure 4A:
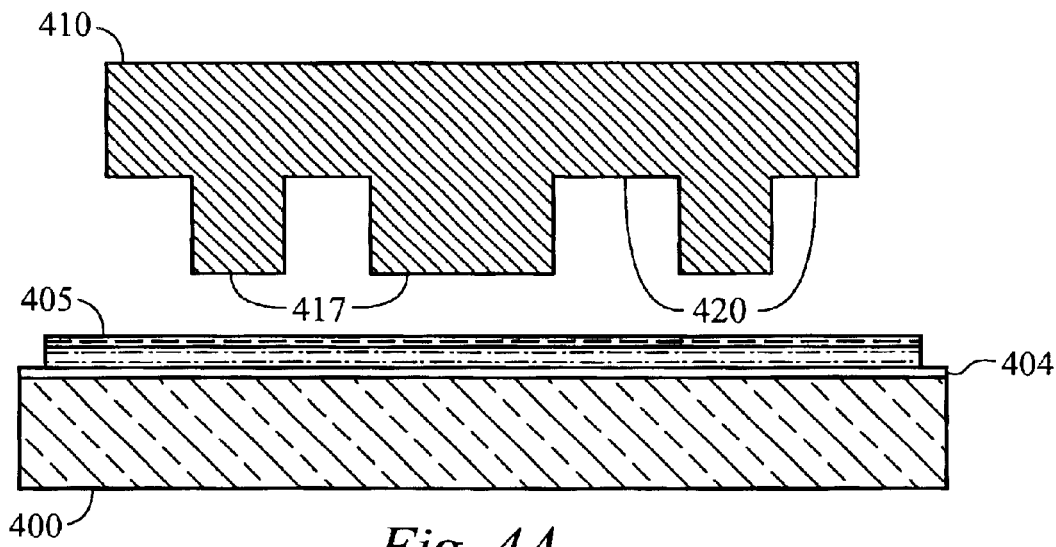
FIGS. 4a–d illustrate patterning a continuous layer of metal nanoparticle ink on a substrate with an interface layer and using a liquid embossing technique, in accordance with the invention.

When the active device 115 is formed by depositing a liquid nanoparticle ink, the printed ink is preferably thermally or photolytically cured to from the active device layer 115. In a preferred embodiment of the invention the active device layer 115 is patterned into an array of electrically isolated gate structures suitable for fabrication of thin film transistors. FIGS. 2, 3, 4ac–c and 5a–c, will now be used to illustrate preferred methods for printing liquid nanoparticle inks onto an interface layer and active device layer onto a substrate comprising an interface layer, such as described above.

FIG. 2 illustrates a method of depositing a nanoparticle print ink 206 using a micro-pipette 201. In accordance with the embodiments of the invention, the metal nanoparticle ink 206 is deposited as droplets 203 onto a substrate 205 comprising an interface layer 204 to form a image or pattern of 207 of droplets 203. This, or any other serial deposition, imaging or writing technique, such as ink-jet, can be used to deposit a continuous or patterned film of nanoparticle ink onto the interface layer 204.

FIG. 3 illustrates a system 325 which utilizes a slide coating bar 301 with an ink reservoir 305 for depositing a continuous film of nanoparticle ink onto a flexible substrate 331 with an interface layer (not shown). After the continuous film of nanoparticle print ink is deposited onto the interface layer of the substrate 331, then the film is embossed with an embossing drum structure 329 comprising a patterned stamp head 326. The embossing drum structure 329 rolls over the continuous film on the substrate 331 to print features 351, 353, 355 and 357 onto the film. The system 325 can be configured to move the substrate 331 in a direction D1, such that the substrate 331 passes under a stationary or moving embossing drum structure 329. When the medium 331 is flexible, the system 325 can be configured with rollers 360 and 361 for controlling the direction, movement and/or tension of the substrate 331.

The system 325 can also be configured with a dryer 303 for curing and/or annealing the printed substrate 331 with photo or thermal energy 309 and an accumulator and/or winder 370 for controlling windup of the printed substrate 331. It will be clear to one skilled in the art that the system 325 can be equipped with any number of other features including, but not limited to, inspection stations, converting stations and alignment features. Further, the system 300 described above can be configured to coat and cure an interface ink in tandem or in a separate process.

FIGS. 4a–e illustrate forming a patterned layer from a continuous layer of nanoparticle ink using a liquid embossing technique. In accordance with the embodiments of the invention, a substrate 400 is provided with an ultra thin interface layer (30 Angstrom or less) comprising a metal and formed by deposition and decomposition of an interface ink, as described above. After the interface layer 404 is formed, then a thin layer 405 of nanoparticle print ink is deposited onto the interface layer 404, such a shown in FIG. 4a. The layer 405 can be formed or deposited onto the interface layer 404 using any suitable techniques including, but not limited to, slide bar coating, ink-jet coating and spin coating.

Figure 4B:
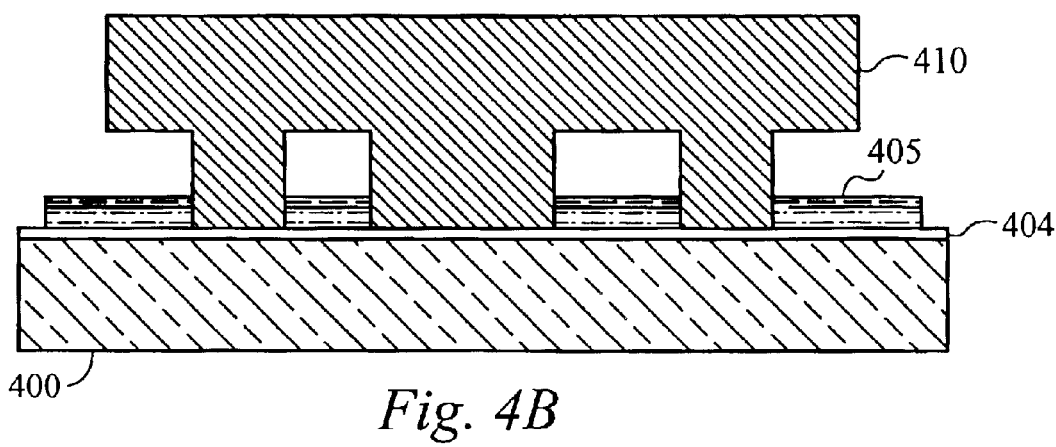

After the layer 405 of nanoparticle ink is deposited onto the interface layer 404, then an elastomeric stamp 410 having a pattern of projecting features 417 and recessed features 420 is lowered until the projecting features 417 make contact with the interface layer 404, thereby displacing metal nanoparticle ink 405 at the regions of contact, such as shown in FIG. 4b.

Figure 4C:
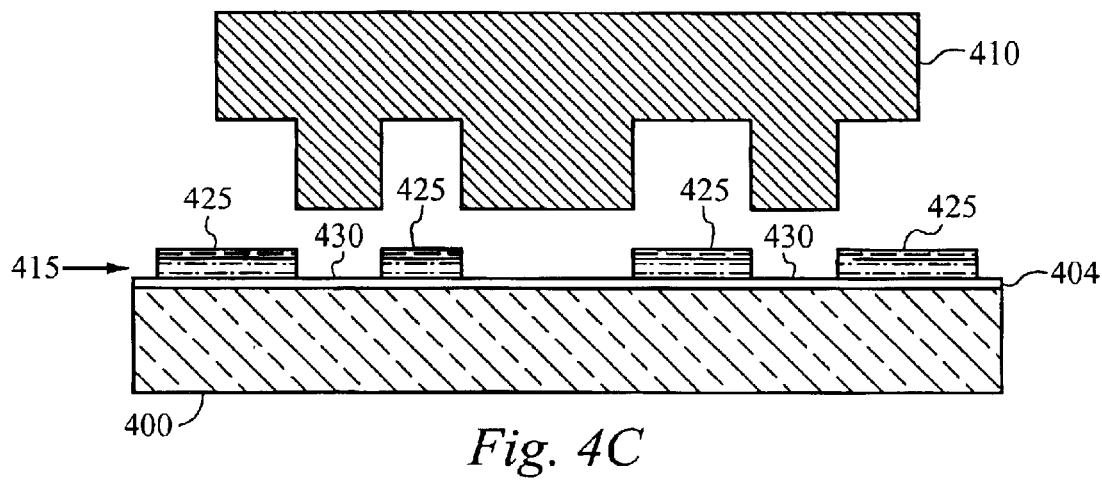

After the layer or metal nanoparticle ink 405 is patterned, then the stamp 410 is removed from the substrate 400 resulting in an array of printed features 425 and channels, as shown in FIG. 4c. The patterned film 415 can then be cured, or alternatively cured while the stamp 410 is in contact with the substrate 410. In accordance with the preferred method of the invention, the channels 430 provide electrical isolation between the printed features 425. Further details of stamps and methods of liquid embossing are described in the U.S. patent application Ser. No. 09/525,734, entitled "Fabrication of Finely Features Devices by Liquid Embossing", and referenced previously.

Figure 4D:
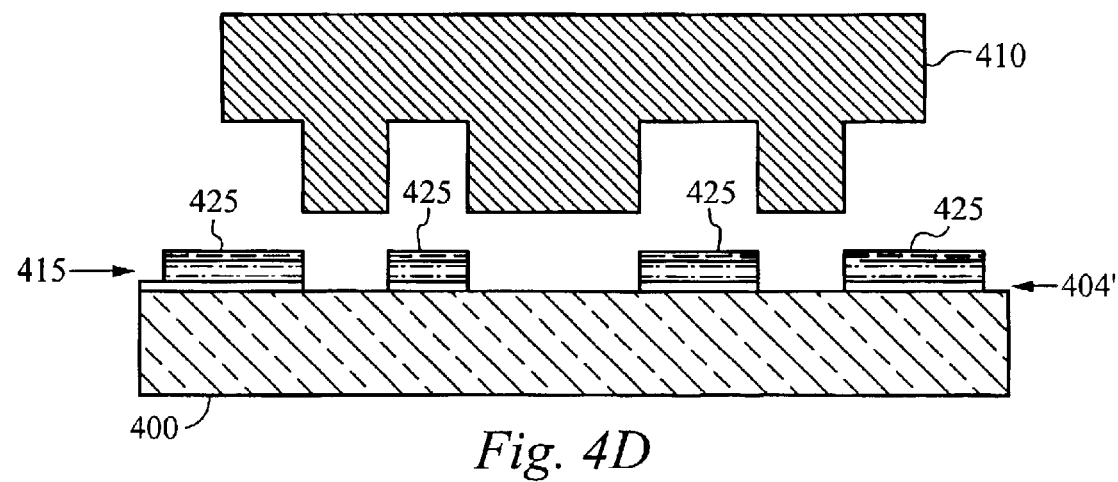

Referring to FIG. 4d, after the patterned film 415 is cured, then the patterned film 415, in accordance with further embodiments of the invention, is used as an etch mask to etch the interface layer 404 and from a patterned interface layer 404'. In yet further embodiments of the invention, the patterned film 415 is used as an etch mask to etch interface layer 404 as well as one or more layers (not shown) below the interface layer 404.

Figure 5A:
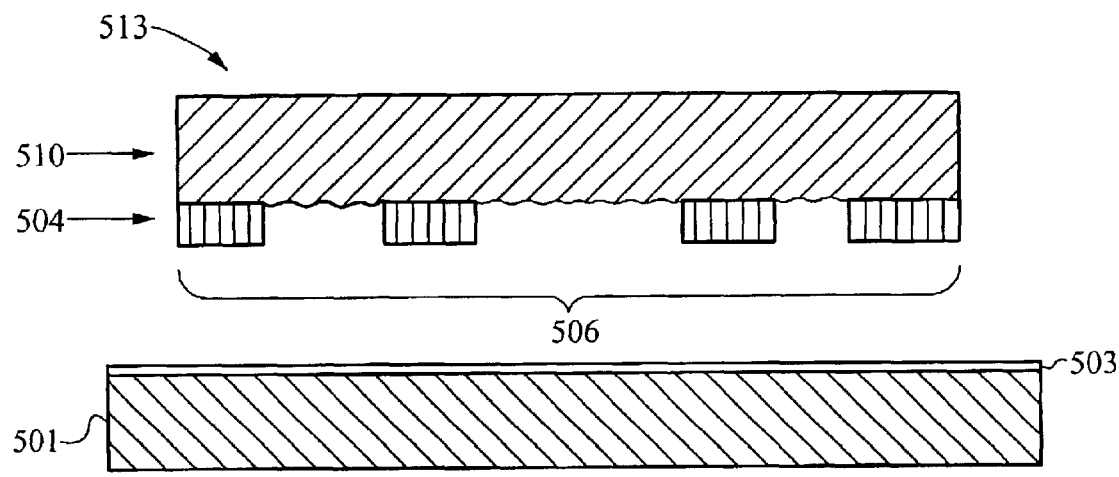
FIGS. 5a–c illustrate forming a patterned layer of a metal nanoparticle ink on a substrate with an interface layer using a micro-stenciling technique, in accordance with the invention.
Figure 5B:
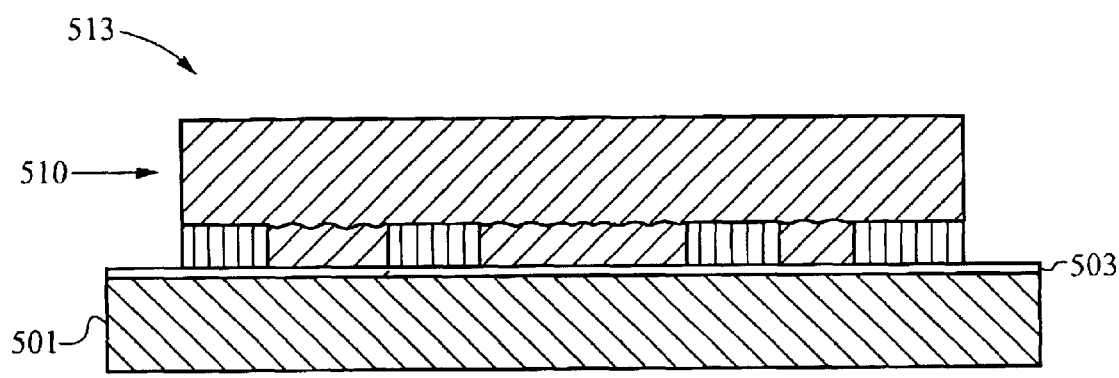
Figure 5C:
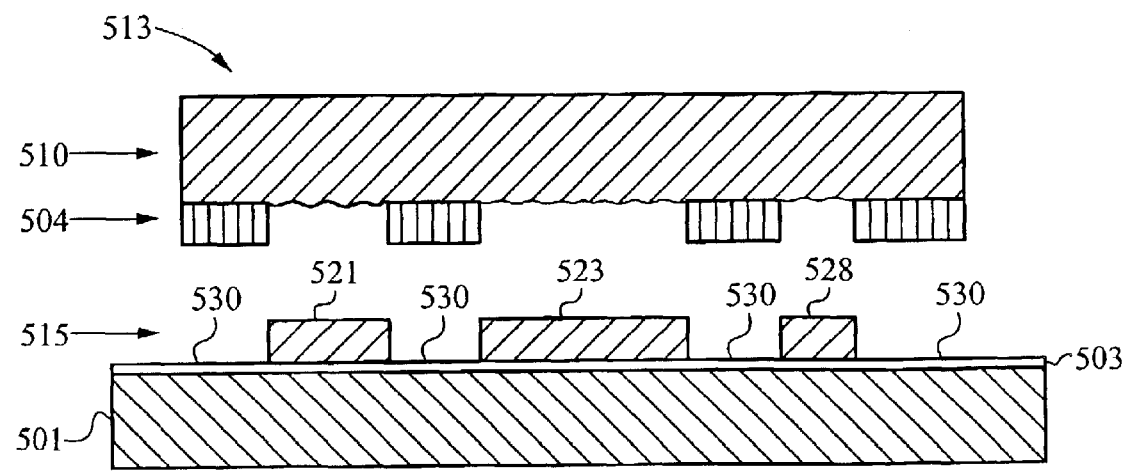
Figure 6:
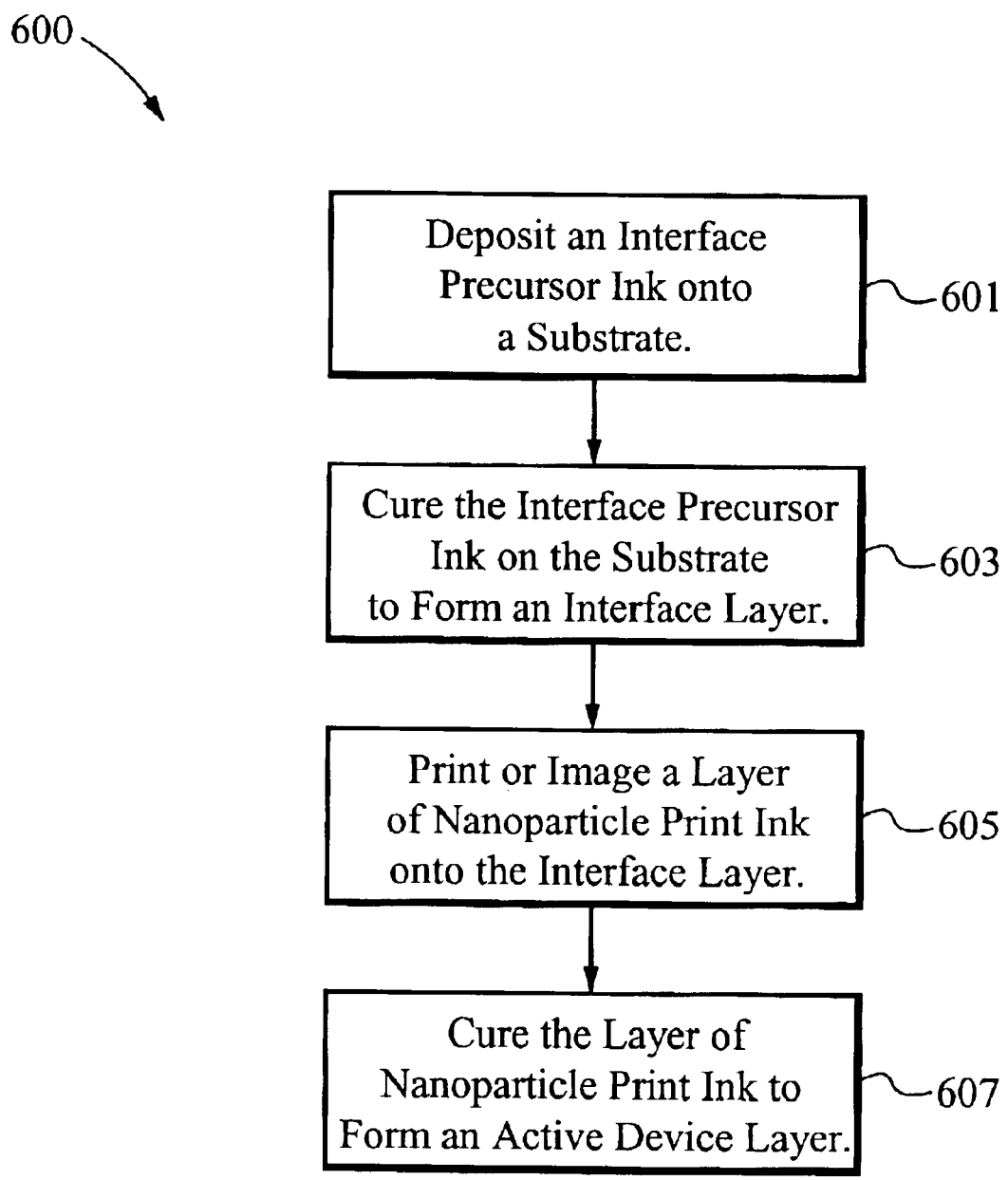
FIG. 6 is a block diagram outlining step for making a device structure comprising a substrate, an active device layer and an interface layer sandwiched between, in accordance with a preferred method of the invention.

FIGS. 5a–c illustrate forming a patterned layer with nanoparticle ink using micro-stencil techniques. In accordance with the embodiments of the invention, a micro-stencil 513 comprises a patterned membrane 504 and a nanoparticle ink supply 510. The print ink supply, preferably comprises a porous structure or membrane, which allows print ink to flow to the print surface 506 of the micro-stencil 513.

To form a patterned layer of nanoparticle ink, an interface layer 503, that is formed on a substrate 501 as described previously, and the print surface 506 of the micro-stencil 513 are brought together, such that ink is directly transferred onto the interface layer 540 through the membrane 504, as shown in FIG. 5b.

After the substrate 501 and the print surface 506 are brought together, then the micro-stencil 513 and the substrate 501 are separated leaving a patterned print layer 515 with print features 521, 523 and 525, such as shown in FIG. 5c. The print layer 515 can then be cured, or alternatively cured while the micro-stencil 513 is in contact with the substrate 501. Addition details of micro-stencils and uses thereof are described in U.S. patent application Ser. No. 10/007,122, entitled "Micro-Stencil", referenced previously.

Regardless of the deposition and/or printing method used, curing metal nanoparticle films typical involves the removal of solvent and/or surfactant from the printed ink. Cured films can be produced which exhibit conductivities in a range of 0–100% of that of bulk metal. Cured films preferably have thicknesses in a range of about 1.0 nanometers to about 1000 nanometers and have compositions that correspond to 80% metal or greater.

FIG. 600 is a block diagram outlining steps for making a device structure with a substrate, an active device layer and an interface layer therebetween, in accordance with a preferred method of the invention. In the step 601 a layer of an interface ink is deposited onto a suitable substrate. In accordance with a preferred embodiment of the invention a Pd-based interface precursor is formed by mixing 0.25 g of Pd(acetate)2, 2.58 g of 2-hexyldecanoic acid in 10 ml of hexane and 10 ml of THF for 6 hours at room temperature. The hexane and THF are then removed in vacuo to yield a red oil, presumably Pd(2-hexyldecanoate)2. Suitable interface ink formulations are then made by dissolving Pd(2-hexyldecanoate)2 in an appropriate solvent to give inks of Wt. % 0–5% Pd. Suitable solvent media include carboxylic acids, hydrocarbons, alcohols, esters, ketones and ethers. Examples include, toluene, cyclohexylbenzene, decaline, 2-ethylhexanol, terpineol, 3-octanol 1-octanol, 2-hexyldecanoic acid, 2-ethythexanoic acid, neodecanoic acid and combinations thereof. Interface ink formulations, in accordance with further embodiments, comprise one or more nonionic surfactants to help wetting the interface ink onto the substrate 101 during the deposition process. Suitable surfactants include, but are not limited to polyethers, amineoxides, alkyl polyglycosides and fatty alcohols. In yet a further embodiment of the invention a Pd-based interface precursor is formed by mixing 1.0 g of Pd(acetate)2, 2.2.3 g of 2-hexyldecanoic acid and 55 ml of 2-ethylhexanol in a flask for 3 hours at room temperature. The reaction is then filtered to yield a solution of 1% Pd by Wt. in 2-ethylhexanol. In this example Pd(2-hexyldecanoate)2 is prepared in situ and used directly without isolation. Similarly, other palladium carboxylates may be prepared in this manner and will have the general formula Pd(OOCR1)(OOCR2) (where R1,2=alkyl, alkenyl, alkynyl or aryl and contain >5 carbon atoms in length). The length of the carbon chain allows for added stability of the Pd organometallic complex in alcohol solvents. The Pd ink may then be deposited onto a substrate (typically 50 ml are spin coated at 3000 rpm for 30 sec.)

After the interface ink is deposited onto the substrate, such as a silicon substrate, then in step 603, the interface layer is cured at 300° C. to yield a thin Pd and/or PdO film and/or PdSi (on the order of 30 angstroms or less). The interface ink can be cured using any suitable method such as described in detail above.

After the interface layer is cured in step 603, then in step 605 nanoparticle ink is deposited onto the cured interface layer, either as a continuous layer that is subsequently patterned or as a patterned layer. In accordance with a preferred method of the invention the nanoparticle print ink is deposited as a continuous layer and is subsequently embossed, as described above.

In accordance with this preferred method of the invention nanoparticles are formed from the reduction of a metal oxide. For example, 58 mg Ag2O (0.25 mmol) are dissolved in a mixture of 1.28 g 2-hexyldecanoic acid (5 mmol) and 2.27 g 1-dodecene at room temperature and 0.28 g oleic acid (1 mmol) is added. The mixture is stirred at room temperature under N2 flow for about 10 minutes. The reaction mixture is heated up to 150° C. and 0.22 ml dodecanal (1 mmol) are injected with a syringe into the reaction mixture. The reaction mixture is stirred at 150° C. under N2 for 90 minutes. The reaction is then rapidly cooled down to room temperature. (Reaction volume=5 ml; [Ag]=0.1M; Ag/2-hexyldecanoic acid=1:10; Ag/oleic acid=1:2; Ag/dodccanal=1:2). After the nanoparticle are synthesized, then the nanoparticles are isolated from the reaction mixture. For example, 10 ml isopropanol are added to the reaction mixture to precipitate the Ag nanoparticles. The precipitate is separated from the supernatant by centrifuging. The precipitate is redissolved in 1 ml toluene. 2 ml isopropanol are then added to this solution. The purified Ag nanoparticles are obtained as precipitate by centrifuging and then dried for 12 hours under N2 flow. After the nanoparticles are isolated, the nanoparticles are either treated with a surfactant and dissolved in an ink solvent or are directly dissolved in an ink solvent and used to form the layer of nanoparticle ink in the step 605. It is understood, that ink solvent, herein does not necessarily refer to a solvent with a singular molecular composition. In fact, mixtures of solvents are in some cases preferred for formulating ink with properties suitable for the substrates and/or deposition process used. Further, in accordance with additional embodiments of the invention, ink formulations include adhesion and/or hardness promoters. Suitable adhesion and/or hardness promoters include metal complexes of Pd, Mg, W, Ni, Cr, Bi, B, Sn, In, Pt. Improved adhesion and hardness has been observed for films printed with Pd carboxylates (0–10% wt.) added to the ink formulation above.

After the layer of nanoparticle ink is deposited in steps 605, then in step 607, the print is cured to form an active device layer. In the example above, the resulting active device layer is a patterned silver layer. As a result of the Pd interface layer formed in steps 603 and 605, the patterned silver layer formed in step 607 and 609 shows improved electrical contact with the substrate, improved adhesion and improved morphology, in comparison with similar layers formed without a Pd-based interfacial layer between the silicon substrate and the pattern silver layer. Further, because the Pd-based interface layer is not conducting laterally, electrically isolated print features can be formed using the method described above. In accordance with further embodiments, in addition to patterning the active device layer, the interface layer is patterned, such that patterned features of the interface layer align with patterned features of the active device layer. The interface layer is pattered prior to forming the device layer, after forming the device layer or while forming the active device layer, as described above.

Figure 7A:
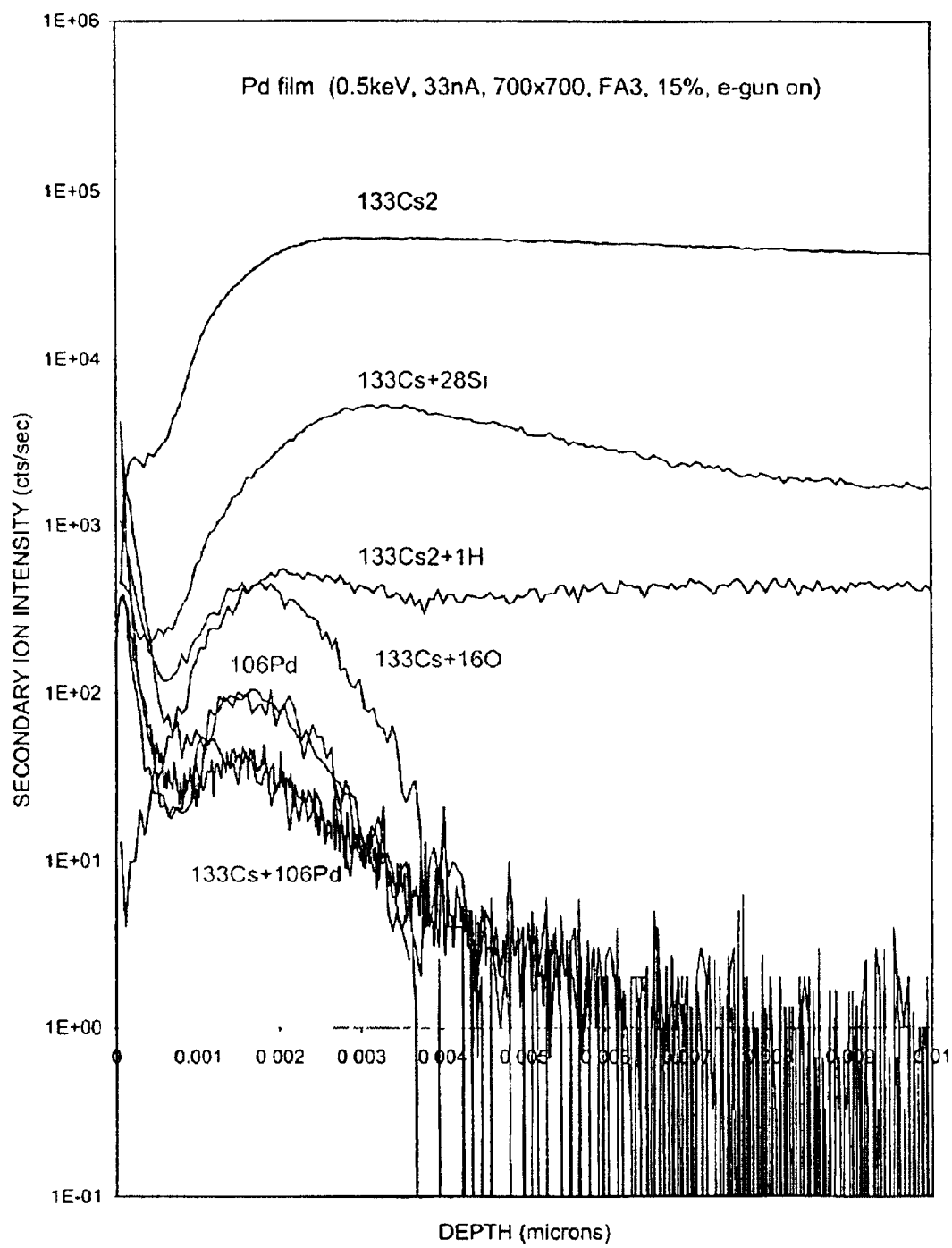
FIGS. 7a–b are plots of Rutherford Backscattering Data for thin Pd-based interface layers, formed in accordance with the embodiments of the invention.
Figure 7B:
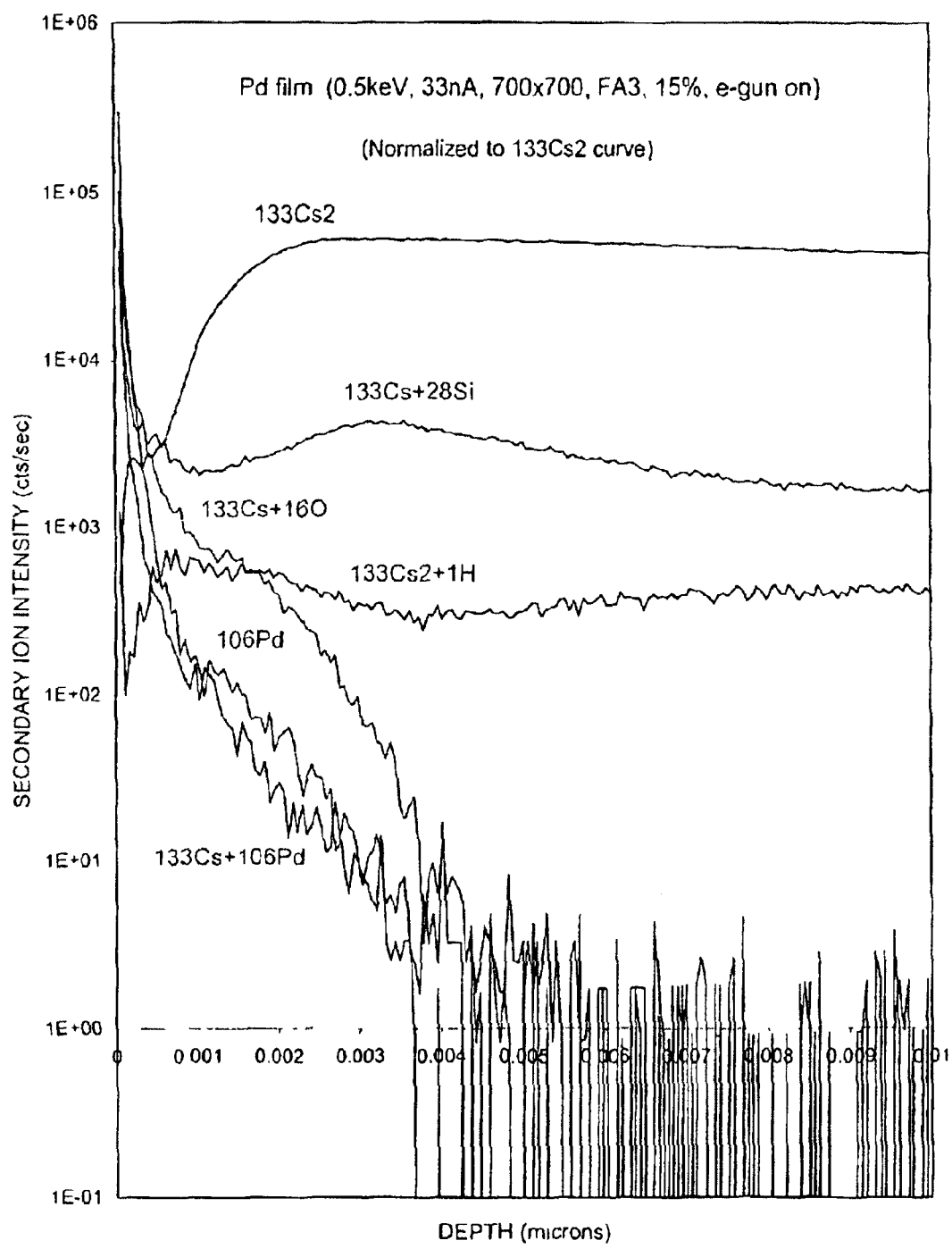

FIGS. 7a–b are plots of Rutherford Backscattering Data for thin Pd-based interface layers formed over a silicon wafer. From the data shown in FIGS. 7a–b, it is not possible to quantify the actual thickness of the films, but the estimated average thicknesses are roughly on the order of 10–30 Angstrom, corresponding to four to five mono-layers of palladium atoms.

The present invention has been described in terms of specific embodiments incorporating details to facilitate the understanding of the principles of construction and operation of the invention. Examples are provided for completeness and any number of precursor ink formulations and print ink formulations are considered to be within the scope of the present invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention. Specifically, while interface layers of the present invention are preferably used to improve Ohmic contact, adhesion and morphology of a printed conductive film, however, the present invention has applications for printing any number of films including dielectric films and semiconducting films in the fabrication of microelectronic devices.

What is claimed is:

1. A method of making an electronic device the method comprising:

a. forming a metal interface layer onto a substrate; and b. forming an active device layer over the metal interface layer, wherein the metal interface layer is in ohmic contact with the active device layer and the substrate and wherein the metal interface layer comprises an oxide or a silicide of the metal.

2. The method of claim 1, wherein the metal interface layer comprises a metal selected from the group consisting of Pd, Pt, Bi, Pb, Sn, Cu, Ni, W, Al, Cr, Ti, Co, Fe and Mo.

3. The method of claim 1, wherein the substrate comprises a material selected from the group consisting of silicon quartz, glass, metal and polymer.

4. The method of claim 1, wherein the metal interface layer is laterally insulating.

5. The method of claim 1, wherein the metal interface layer has an average thickness in a range of 1.0 to 300 Angstroms.

6. The method of claim 1, wherein forming the metal interface layer comprises:

a. depositing conductive metal layer with a first thickness; and b. etching the conductive metal layer to a second thickness to form the metal interface layer, wherein the metal interface layer is laterally insulating.

7. The method of claim 1, wherein forming the metal interface layer comprising depositing a metal-based material using a method selected from the group consisting of screen coating, dip coating, spin coating, ink-jet coating, sputter coating, slides coating, extrusion coating meniscus coating, and spray coating.

8. The method of claim 1, wherein the forming the metal interface layer comprises:

a depositing a metal precursor layer; and b. curing the metal precursor layer.

9. The method of claim 8, wherein the metal precursor layer comprises a metal complex, selected from the group consisting of carboxylates, alkoxides, alkyls, aryls, alkynes, alkenes, β-diktonates, amides and thiolates.

10. The method of claim 8, wherein the curing the metal precursor layer comprises a method selected from the group consisting of thermal curing, electron beam curing and photo curing.

11. The method of claim 1, wherein forming at least one of the interface layer and the active device layer comprises depositing a layer of ink solution comprising metal nanoparticles.

12. The method of claim 11, wherein the metal nanoparticles comprise a metal selected from the group consisting of Ag, Pd, Rh, Cu, Pt, Ni, Fe, Ru, Os, Mn, Sn, Cr, Mo, W, Co, Ir, Zn and Cd.

13. The method of claim 11, wherein the layer of ink solution is deposited as a continuous layer of the ink solution.

14. The method of claim 13, wherein the continuous layer of ink solution is deposited using a method selected from the group consisting of screen coating, dip coating, spin coating, ink-jet coating, sputter coating, slides coating, extrusion coating meniscus coating, and spray coating.

15. The method of claim 13, further comprising patterning the continuous layer of ink solution using a method selected from the group consisting of liquid embossing, imaging and etching.

16. The method of claim 11, wherein the layer of ink solution is deposited in a pattern.

17. The method of claim 16, wherein the layer of ink solution is deposited in a pattern using a method selected from the group consisting of inkjet printing or micro-stencil printing.

18. A method of making a conductive device layer comprising:
   a forming an anisotropic conducting layer on a substrate; and
   b. forming the conducting device layer on the anisotropic conducting film, wherein the anisotropic conducting film provides ohmic contact between the conducting device layer and the substrate.

19. The method of claim 18, wherein the anisotropic conducting layer comprises a metal selected from the group consisting of Pd, Pt, Bi, Pb, Sn, Cu, Ni, W, Al, Cr, Ti, Co, Fe and Mo.

20. The method of claim 18, wherein the substrate comprises a material selected from the group consisting of a silicon substrate, a quartz substrate, a glass substrate, metal and a polymeric substrate.

21. The method of claim 18, wherein the anisotropic conducting layer has an average thickness of 30 Angstroms or less.

22. The method of claim 21, wherein forming the conducting device layer comprises:
   a. depositing conductive metal layer with an average thickness greater than 30 Angstroms; and
   a. etching the conductive metal layer to have the average thickness of 30 Angstroms or less.

23. The method of claim 18, wherein forming the anisotropic conducting layer comprising depositing metal using a method selected from the group consisting of spin coating, ink-jet coating and sputter coating.

24. The method of claim 18, wherein the forming anisotropic conducting film comprises:
   a. depositing a metal precursor layer; and
   b. curing the metal precursor layer.

25. The method of claim 24, wherein the curing the metal precursor layer comprises at least one of thermal curing and photo curing.

26. The method of claim 18, wherein forming the conductive device layer comprises depositing a layer of ink solution comprising metal nanoparticles.

27. The method of claim 26, wherein the metal nanoparticles comprise a metal selected from the group consisting of Ag, Pd, Rh, Cu, Pt, Ni, Fe, Ru, Os, Mn, Sn, Cr, Mo, W, Co, Ir, Zn and Cd.

28. The method of claim 26, wherein forming the conductive device layer comprises depositing a continuous layer of the ink solution.

29. The method of claim 28, wherein the continuous layer of ink solution is deposited using a method selected from the group consisting of inkjet printing, slides coating or spin coating.

30. The method of claim 28, further comprising patterning the continuous layer of ink solution by a method selected from the group consisting of liquid embossing, imaging and etching.

31. The method of claim 26, wherein forming the conductive device layer comprises depositing the ink solution in a pattern.

32. The method of claim 31, wherein the depositing the ink solution in a pattern uses a deposition method selected from the group consisting of ink-jet printing and micro-stencil printing.

33. The method of claim 18, wherein the anisotropic conducting film comprises an oxide or a silicide of the metal.

34. The method of claim 1, wherein forming an active device layer metal comprises:
   a. depositing metal nanoparticles comprise a metal selected from the group consisting of Ag, Pd, Rh, Cu, Pt, Ni, Fe, Ru, Os, Mn, Sn, Cr, Mo, W, Co, Ir, Zn and Cd; and
   b. curing the metal nanoparticles.

35. A method of making a conductive device layer comprising:
   a. depositing a layer of ink solution comprising metal nanoparticles onto a thin metal-based adhesion layer; and
   b. curing the ink solution, wherein the nanoparticles fuse to form the conductive device layer.

36. The method of claim 35, wherein the metal nanoparticles comprise a metal selected from the group consisting of Ag, Pd, Rh, Cu, Pt, Ni, Fe, Ru, Os, Mn, Sn, Cr, Mo, W, Co, Ir, Zn and Cd.

37. The method of claim 35, wherein the layer of ink solution is continuous.

38. The method of claim 35, further comprising patterning the layer of ink solution prior to curing the ink solution.

39. The method of claim 35, wherein the layer of ink solution is deposited using a method selected from the group consisting ink-jet coating, slides coating or spin coating.

40. The method of claim 38, wherein patterning the layer of ink solution comprises a step selected from the group consisting of embossing, imaging and etching techniques.

41. The method of claim 35, wherein layer of ink solution is selectively deposited in a pattern.

42. The method of claim 41, wherein ink solution is selectively deposited in a pattern using a method selected from the group consisting of ink-jet printing and micro-stencil printing.

43. The method of claim 35, wherein the curing comprises exposing the layer of ink to radiation.

44. The method of claim 35, wherein thin metal-based adhesion layer comprises a metal selected from the group consisting of Pd, Pt, Bi, Pb, Sn, Cu, Ni, W, Al, Cr, Ti, Co, Fe and Mo.

45. The method of claim 35, wherein the metal interface film is laterally insulating.

46. The method of claim 35, further comprising forming the thin metal-based adhesion layer, wherein forming the thin metal-based adhesion layer comprises depositing a layer of liquid comprising metal nanoparticles and curing the liquid.

47. The method of claim 46, wherein the metal nanoparticles comprise a metal selected from the group consisting of Ag, Pd, Rh, Cu, Pt, Ni, Fe, Ru, Os, Mn, Sn, Cr, Mo, W, Co, Ir, Zn and Cd.

48. A method of making a device comprising:
   a. depositing a layer of liquid interface ink;

b. curing layer of liquid interface ink to from an interface layer with a thickness of 30 Angstroms or less:

c. depositing a layer of liquid device ink; and d. patterning the layer of liquid device ink to form a patterned device layer, wherein the interface layer is in ohmic contact with the patterned device layer and is laterally insulating.

49. The method of claim 48, further comprising patterning the interface layer ink.

50. The method of claim 49, wherein the interface layer ink is patterned prior to depositing the layer of liquid device ink.

51. The method of claim 50, wherein patterning the interface layer comprises embossing the layer of interface ink with an elastomeric stamp.

52. The method of claim 49, wherein the interface layer is patterned concurrently with the layer of liquid device ink.

53. The method of claim 52, wherein patterning the interface layer and the layer of liquid device ink concurrently comprises embossing the layer of interface ink and the layer of liquid device ink with an elastomeric stamp.

54. The method of claim 49, wherein patterning the interface layer comprises etching the interface layer through the patterned device layer.

55. The method of claim 54, further comprising etching at least one device layer below the interface layer.

56. A method of making an electronic device the method comprising:

a forming a anisotropic conducting metal interface layer onto a substrate; and b. forming an active device layer over the anisotropic conducting metal interface layer, wherein the anisotropic conducting metal interface layer is in ohmic contact with the active device layer and the substrate.

* * * * *

UNITED STATES PATENT AND TRADEMARK OFFICE
CERTIFICATE OF CORRECTION

PATENT NO. : 6,911,385 B1
DATED : June 28, 2005
INVENTOR(S) : Scott Haubrich et al.

It is certified that error appears in the above-identified patent and that said Letters Patent is hereby corrected as shown below:

Column 5,
Line 20, replace "01" with -- 101 --.

Column 13,
Lines 9 and 11, the word "ink" should be omitted.

Signed and Sealed this

Thirtieth Day of August, 2005

JON W. DUDAS
*Director of the United States Patent and Trademark Office*